(12) United States Patent
Sander et al.

(10) Patent No.: US 6,816,016 B2
(45) Date of Patent: Nov. 9, 2004

(54) HIGH-EFFICIENCY MODULATING RF AMPLIFIER

(75) Inventors: Wendell B. Sander, Los Gatos, CA (US); Ronald A. Meck, Soquel, CA (US); Earl McCune, Santa Clara, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 10/688,444

(22) Filed: Oct. 16, 2003

(65) Prior Publication Data

US 2004/0080364 A1 Apr. 29, 2004

Related U.S. Application Data

(63) Continuation of application No. 09/637,269, filed on Aug. 10, 2000, now Pat. No. 6,636,112.

(51) Int. Cl.[7] .............................. H03F 3/68; H03F 1/14; H03F 3/217
(52) U.S. Cl. .......................... 330/295; 330/51; 330/251
(58) Field of Search ............................... 330/10, 124 R, 330/134, 207 A, 251, 285, 295, 51

(56) References Cited

U.S. PATENT DOCUMENTS

| | | | |
|---|---|---|---|
| 3,900,823 A | | 8/1975 | Sokal et al. .................. 330/149 |
| 5,256,987 A | * | 10/1993 | Kibayashi et al. ........... 330/295 |
| 5,410,276 A | | 4/1995 | Hwang et al. ............... 330/297 |
| 5,796,306 A | * | 8/1998 | Tsumura ................... 330/124 R |
| 6,069,525 A | * | 5/2000 | Sevic et al. .................... 330/51 |
| 6,111,459 A | * | 8/2000 | Nishijima et al. ............. 330/51 |
| 6,198,347 B1 | | 3/2001 | Sander et al. ................ 330/251 |
| 6,201,452 B1 | * | 3/2001 | Dent et al. ................... 332/103 |
| 6,256,482 B1 | | 7/2001 | Raab .......................... 455/108 |
| 6,295,442 B1 | | 9/2001 | Camp, Jr. et al. ............ 455/102 |
| 6,377,784 B2 | | 4/2002 | McCune ..................... 455/108 |

FOREIGN PATENT DOCUMENTS

FR          2768574        3/1999      ............. H03F/3/20

OTHER PUBLICATIONS

Chiba et al., Linearized Saturation Amplifier with Bidirectional Control for Digital Mobile Radio: 1990, IEEE, NTT Radio Communication System Laboratories, pp. 1958–1962.

* cited by examiner

Primary Examiner—Steven J. Mottola
(74) Attorney, Agent, or Firm—Thelen Reid & Priest LLP

(57) ABSTRACT

The present invention, generally speaking, provides for high-efficiency power control of a high-efficiency (e.g., hard-limiting or switch-mode) power amplifier in such a manner as to achieve a desired control or modulation. Unlike the prior art, feedback is not required. That is, the amplifier may be controlled without continuous or frequent feedback adjustment. In one embodiment, the spread between a maximum frequency of the desired modulation and the operating frequency of a switch-mode DC-DC converter is reduced by following the switch-mode converter with an active linear regulator. The linear regulator is designed so as to control the operating voltage of the power amplifier with sufficient bandwidth to faithfully reproduce the desired amplitude modulation waveform. The linear regulator is further designed to reject variations on its input voltage even while the output voltage is changed in response to an applied control signal. This rejection will occur even though the variations on the input voltage are of commensurate or even lower frequency than that of the controlled output variation. Amplitude modulation may be achieved by directly or effectively varying the operating voltage on the power amplifier while simultaneously achieving high efficiency in the conversion of primary DC power to the amplitude modulated output signal. High efficiency is enhanced by allowing the switch-mode DC-to-DC converter to also vary its output voltage such that the voltage drop across the linear regulator is kept at a low and relatively constant level. Time-division multiple access (TDMA) bursting capability may be combined with efficient amplitude modulation, with control of these functions being combined. In addition, the variation of average output power level in accordance with commands from a communications system may also be combined within the same structure.

25 Claims, 12 Drawing Sheets

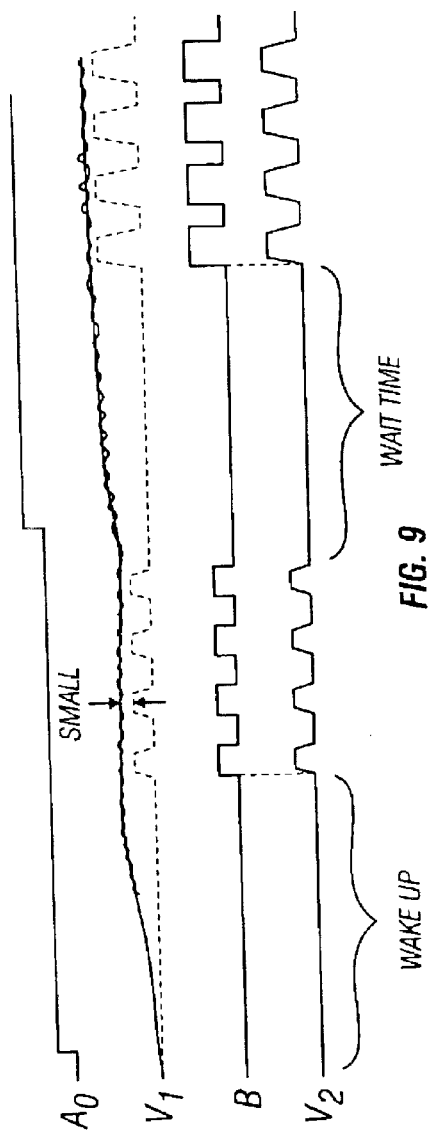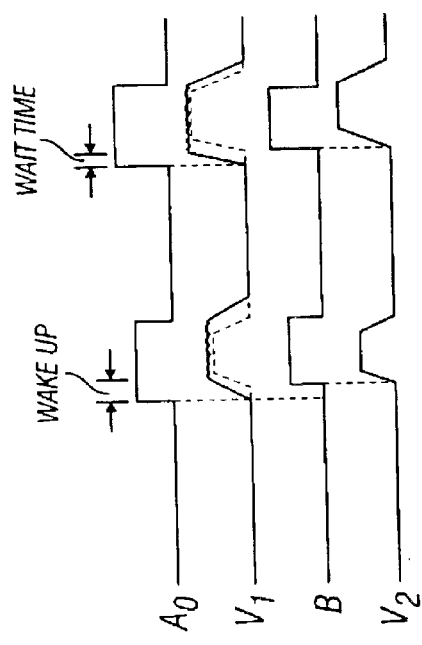

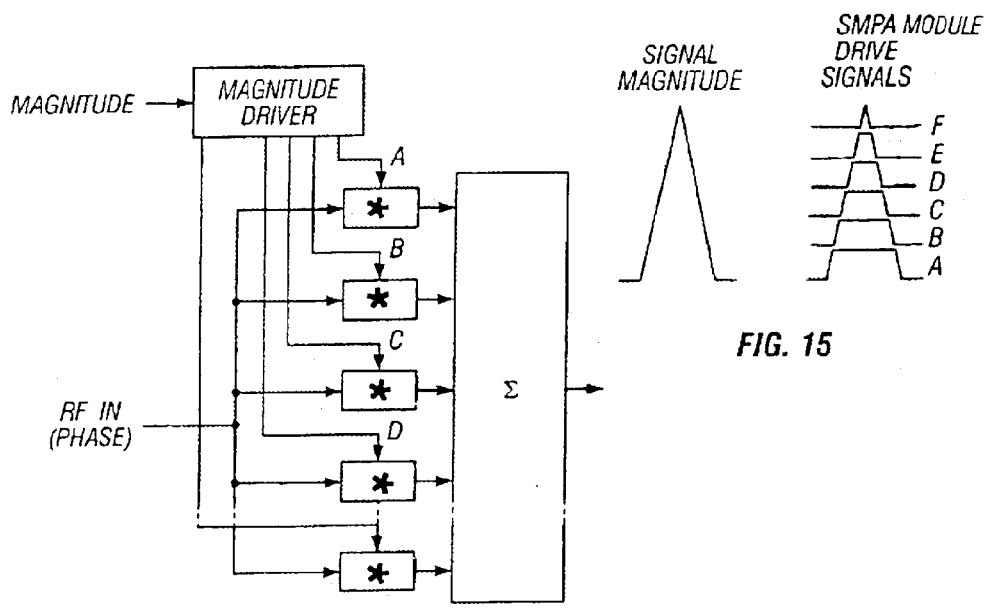
FIG. 14
FIG. 15
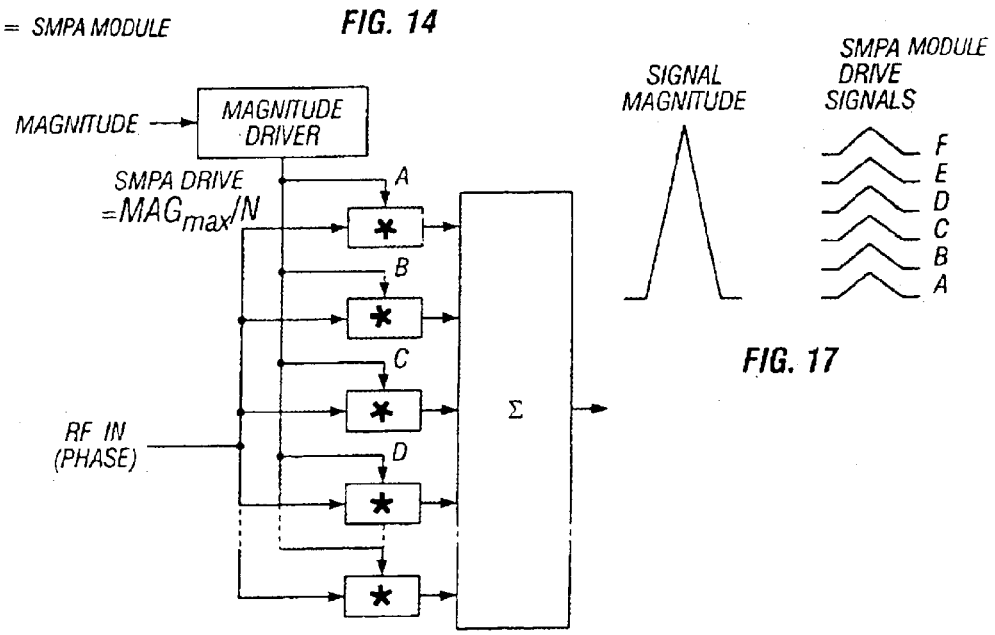
FIG. 16
FIG. 17

HIGH-EFFICIENCY MODULATING RF AMPLIFIER

CROSS-REFERENCE TO RELATED APPLICATIONS

This application is a continuation of U.S patent application Ser. No. 09/637,269, now U.S. Pat. No. 6,636,112, which was filed on Aug. 10, 2000.

BACKGROUND OF THE INVENTION

1. Field of the Invention

The present invention relates to RF amplifiers and signal modulation.

2. State of the Art

Battery life is a significant concern in wireless communications devices such as cellular telephones, pagers, wireless modems, etc. Radio-frequency transmission, especially, consumes considerable power. A contributing factor to such power consumption is inefficient power amplifier operation. A typical RF power amplifier for wireless communications operates with only about 10% efficiency. Clearly, a low-cost technique for significantly boosting amplifier efficiency would satisfy an acute need.

Furthermore, most modern digital wireless communications devices operate on a packet basis. That is, the transmitted information is sent in a series of one or more short bursts, where the transmitter is active only during the burst times and inactive at all other times. It is therefore also desirable that control of burst activation and deactivation be controlled in an energy-efficient manner, further contributing to extended battery life.

Power amplifiers are classified into different groups: Class A, Class B, Class AB, etc. The different classes of power amplifiers usually signify different biasing conditions. In designing an RF power amplifier, there is usually a trade-off between linearity and efficiency. The different classes of amplifier operation offer designers ways to balance these two parameters.

Generally speaking, power amplifiers are divided into two different categories, linear and non-linear. Linear amplifiers (e.g. Class A amplifiers and Class B push-pull amplifiers), maintain high linearity, resulting in faithful reproduction of the input signal at their output since the output signal is linearly proportional to the input signal. In non-linear amplifiers (e.g. single-ended Class B and Class C amplifiers), the output signal is not directly proportional to the input signal. The resulting amplitude distortion on the output signal makes these amplifiers most applicable to signals without any amplitude modulation, which are also known as constant-envelope signals.

Amplifier output efficiency is defined as the ratio between the RF output power and the input (DC) power. A major source of power amplifier inefficiency is power dissipated in the transistor. A Class A amplifier is inefficient since current flows continuously through the device. Conventionally, efficiency is improved by trading-off linearity for increased efficiency. In Class B amplifiers, for example, biasing conditions are chosen such that the output signal is cut off during half of the cycle unless the opposing half is provided by a second transistor (push-pull). As a result, the waveform will be less linear. The output waveform may still be made sinusoidal using a tank circuit or other filter to filter out higher and lower frequency components.

Class C amplifiers conduct during less than 50% of the cycle, in order to further increase efficiency; i.e., if the output current conduction angle is less than 180 degrees, the amplifier is referred to as Class C. This mode of operation can have a greater efficiency than Class A or Class B, but it typically creates more distortion than Class A or Class B amplifiers. In the case of a Class C amplifier, there is still some change in output amplitude when the input amplitude is varied. This is because the Class C amplifier operates as a constant current source—albeit one that is only on briefly—and not a switch.

The remaining classes of amplifiers vigorously attack the problem of power dissipation within the transistor, using the transistor merely as a switch. The underlying principle of such amplifiers is that a switch ideally dissipates no power, for there is either zero voltage across it or zero current through it. Since the switch's V-I product is therefore always zero, there is no dissipation in this device. A Class E power amplifier uses a single transistor, in contrast with a Class D power amplifier, which uses two transistors In real life, however, switches are not ideal. (Switches have turn on/off time and on-resistance.) The associated dissipation degrades efficiency. The prior art has therefore sought for ways to modify so-called "switch-mode" amplifiers (in which the transistor is driven to act as a switch at the operating frequency to minimize the power dissipated while the transistor is conducting current) so that the switch voltage is zero for a non-zero interval of time about the instant of switching, thereby decreasing power dissipation. The Class E amplifier uses a reactive output network that provides enough degrees of freedom to shape the switch voltage to have both zero value and zero slope at switch turn-on, thus reducing switching losses. Class F amplifiers are still a further class of switch-mode amplifiers. Class F amplifiers generate a more square output waveform as compared to the usual sinewave. This "squaring-up" of the output waveform is achieved by encouraging the generation of odd-order harmonics (i.e., ×3, ×5, ×7, etc.) and suppressing the even-order harmonics (i.e., ×2, ×4, etc.) in the output network.

An example of a known power amplifier for use in a cellular telephone is shown in FIG. 1. GSM cellular telephones, for example, must be capable of programming output power over a 30 dBm range. In addition, the transmitter turn-on and turn-off profiles must be accurately controlled to prevent spurious emissions. Power is controlled directly by the DSP (digital signal processor) of the cellular telephone, via a DAC (digital to analog converter). In the circuit of FIG. 1, a signal GCTL drives the gate of an external AGC amplifier that controls the RF level to the power amplifier. A portion of the output is fed back, via a directional coupler, for closed-loop operation. The amplifier in FIG. 1 is not a switch-mode amplifier. Rather, the amplifier is at best a Class AB amplifier driven into saturation, and hence demonstrates relatively poor efficiency.

FIG. 2 shows an example of a known Class E power amplifier, described in U.S. Pat. No. 3,919,656. An RF input signal is coupled over a lead 1 to a driver stage 2, the latter controlling the active device 5 via a signal coupled over a lead 3. The active device 5 acts substantially as a switch when appropriately driven by the driver 2. The output port of the active device is therefore represented as a single-pole single-throw switch 6. Connected across the switch 6 is the series combination of a DC power supply 7 and the input port of a load network 9. The output port of the load network 9 is connected to the load 11. As the switch 6 is cyclically operated at the desired AC output frequency, DC energy from the power supply 7 is converted into AC energy at the switching frequency (and harmonics thereof).

U.S. Pat. No. 3,900,823 to Sokal et al. describes feedback control of Class E power amplifiers. The need for feedback control suggests the inability to fully characterize device behavior, which in turn suggests substantial departure from operation of the device as a true switch. Sokal further describes a solution to the problem of feedthrough power control at low power levels by controlling RF input drive magnitude through application of negative feedback techniques to control the DC power supply of one or more preceding stages. The need for feedback control imposes constraints of feedback loop dynamics on a system.

The Class E amplifier arrangement of FIG. 2, although it is theoretically capable of achieving high conversion efficiency, suffers from the disadvantage that large voltage swings occur at the output of the active device, due to ringing. This large voltage swing, which typically exceeds three times the supply voltage, precludes the use of the Class E circuit with certain active devices which have a low breakdown voltage.

To operate an RF power amplifier in switch mode, it is necessary to drive the output transistor(s) rapidly between cutoff and full-on, and then back to cutoff, in a repetitive manner. The means required to achieve this fast switching is dependent on the type of transistor chosen to be used as the switch: for a field-effect transistor (FET), the controlling parameter is the gate-source voltage, and for a bipolar transistor (BJT, HBT) the controlling parameter is the base-emitter current.

However, the driving circuit in the RF amplifier of FIG. 2 typically includes a matching network consisting of a tuned (resonant) circuit. Referring to FIG. 3, in such an arrangement, an RF input signal is coupled to a driver amplifier, typically of Class A operation. An output signal of the driver amplifier is coupled through the matching network to a control terminal of the switching transistor, shown in FIG. 3 as an FET. As with design of the load network of FIG. 2, proper design of the matching network is not an easy matter.

Various designs have attempted to improve on different aspects of the basic Class E amplifier. One such design is described in Choi et al., *A Physically Based Analytic Model of FET Class-E Power Amplifiers—Designing for Maximum PAE*, IEEE Transactions on Microwave Theory and Techniques, Vol. 47, No. 9, September 1999. This contribution models various non-idealities of the FET switch and from such a model derives conclusions about advantageous Class E amplifier design. For the chosen topology, maximum power-added efficiency (PAE) of about 55% occurs at a power level of one-half watt or less. At higher powers, PAE is dramatically reduced, e.g., less than 30% at 2W.

The PAE of a power amplifier is set by the amount of DC supply power required to realize the last 26 dB of gain required to achieve the final output power. (At this level of gain, the power input to the amplifier through the driving signal—which is not readily susceptible to measurement—becomes negligible.) Presently, there are no known amplifying devices capable of producing output powers of 1W or greater at radio frequencies and that also provide a power gain of at least 26 dB. Accordingly, one or more amplifiers must be provided ahead of the final stage, and the DC power consumed by such amplifiers must be included in the determination of overall PAE.

Conventional design practice calls for an amplifier designer to impedance-match the driver output impedance to the input impedance of the final switching transistor. The actual output power therefore required from the driver stage is defined by the required voltage (or current) operating into the (usually low) effective input impedance of the switching element. A specific impedance for the input of the switching transistor is not definable, since the concept of impedance requires linear operation, and a switch is very nonlinear.

An example of an RF amplifier circuit in accordance with the foregoing approach is shown in FIG. 4. An interstage "T section" consisting of an inductor L1, a shunt capacitor C and an inductor L2 is used to match the driver stage to an assumed 50 ohm load (i.e., the final stage).

This conventional practice treats the interstage between the drive and final stages as a linear network, which it is not. Further, the conventional practice maximizes power transfer between the driver and final stages (an intended consequence of impedance matching). Thus, for example, in order to develop the required drive voltage for a FET as the switching transistor, the driver must also develop in-phase current as well to provide the impedance-matched power.

Another example of a conventional RF power amplifier circuit is shown in FIG. 5. This circuit uses "resonant interstage matching" in which the drive and final stages are coupled using a coupling capacitor Ccpl.

As noted, conventional design practice fails to achieve high PAE at high output power (e.g., 2W, a power level commonly encountered during the operation of a cellular telephone). A need therefore exists for an RF power amplifier that exhibits high PAE at relatively high output powers.

Survey of Prior Patents

Control of the output power from an amplifier is consistently shown as requiring a feedback structure, as exemplified by Sokal et al. and further exemlified in the following U.S. Pat. Nos. 4,392,245; 4,992,753; 5,095,542; 5,193,223; 5,369,789; 5,410,272; 5,697,072 and 5,697,074. Other references, such as U.S. Pat. No. 5,276,912, teach the control of amplifier output power by changing the amplifier load circuit.

A related problem is the generation of modulated signals, e.g., amplitude modulated (AM) signals, quadrature amplitude modulated signals (QAM), etc. A known IQ modulation structure is shown in FIG. 6. A data signal is applied to a quadrature modulation encoder that produces I and Q signals. The I and Q signals are applied to a quadrature modulator along with a carrier signal. The carrier signal is generated by a carrier generation block to which a tuning signal is applied.

Typically, an output signal of the quadrature modulator is then applied to a variable attenuator controlled in accordance with a power control signal. In other instances, power control is implemented by vaying the gain of the amplifier. This is achieved by adjusting the bias on transistors within the inear amplifier, taking advantage of the effect where transistor transconductance varies with the aplied bias conditions. Since amplifier gain is strongly related to the transistor transconductance, varying the transconductance effectively varies the amplifier gain. A resulting signal is then amplified by a linear power amplifier and applied to an antenna.

In AM signals, the amplitude of the signal is made substantially proportional to the magnitude of an information signal, such as voice. Information signals such as voice are not constant in nature, and so the resulting AM signals are continuously varying in output power.

A method for producing accurate amplitude modulated signals using non-linear Class C amplifiers, called "plate modulation," has been known for over 70 years as described in texts such as Terman's *Radio Engineers Handbook* (McGraw-Hill, 1943). In the typical plate-modulation technique, output current from the modulator amplifier is linearly added to the power supply current to the amplifying element (vacuum tube or transistor), such that the power supply current is increased and decreased from its average value in accordance with the amplitude modulation. This varying current causes the apparent power supply voltage on the amplifying element to vary, in accordance with the resistance (or conductance) characteristics of the amplifying element.

By using this direct control of output power, AM can be effected as long as the bandwidth of the varying operating voltage is sufficient. That is, these non-linear amplifiers actually act as linear amplifiers with respect to the amplifier operating voltage. To the extent that this operating voltage can be varied with time while driving the nonlinear power amplifier, the output signal will be linearly amplitude modulated.

Other methods of achieving amplitude modulation include the combination of a multitude of constant amplitude signals, as shown in the following U.S. Pat. Nos. 4,580,111; 4,804,931; 5,268,658 and 5,652,546. Amplitude modulation by using pulse-width modulation to vary the power supply of the power amplifier is shown in the following U.S. Pat. Nos. 4,896,372; 3,506,920; 3,588,744 and 3,413,570. However, the foregoing patents teach that the operating frequency of the switch-mode DC-DC converter must be significantly higher than the maximum modulation frequency.

U.S. Pat. No. 5,126,688 to Nakanishi et al. addresses the control of linear amplifiers using feedback control to set the actual amplifier output power, combined with periodic adjustment of the power amplifier operating voltage to improve the operating efficiency of the power amplifier. The primary drawback of this technique is the requirement for an additional control circuit to sense the desired output power, to decide whether (or not) the power amplifier operating voltage should be changed to improve efficiency, and to effect any change if so decided. This additional control circuitry increases amplifier complexity and draws additional power beyond that of the amplifier itself, which directly reduces overall efficiency.

A further challenge has been to generate a high-power RF signal having desired modulation characteristics. This object is achieved in accordance with the teachings of U.S. Pat. No. 4,580,111 to Swanson by using a multitude of high efficiency amplifiers providing a fixed output power, which are enabled in sequence such that the desired total combined output power is a multiple of this fixed individual amplifier power. In this scheme, the smallest change in overall output power is essentially equal to the power of each of the multitude of high efficiency amplfiers. If finely graded output power resolution is required, then potentially a very large number of individual high efficiency amplifiers may be required. This clearly increases the overall complexity of the amplifier.

U.S. Pat. No. 5,321,799 performs polar modulation, but is restricted to full-response data signals and is not useful with high power, high-efficiency amplifiers. The patent teaches that amplitude variations on the modulated signal are applied through a digital multiplier following phase modulation and signal generation stages. The final analog signal is then developed using a digital-to-analog converter. As stated in the State of the Art section herein, signals with information already implemented in amplitude variations are not compatible with high-efficiency, nonlinear power amplifiers due to the possibly severe distortion of the signal amplitude variations.

Despite the teachings of the foregoing references, a number of problems remain to be solved, including the following: to achieve high-efficiency amplitude modulation of an RF signal by varation of the operating voltage using a switch mode converter without requiring high-frequency switch-mode operation (as compared to the modulation frequency); to unify power-level and burst control with modulation control; to enable high-efficiency modulation of any desired character (amplitude and/or phase); and to enable high-power operation (e.g., for base stations) without sacrificing power efficiency.

SUMMARY OF THE INVENTION

The present invention, generally speaking, provides for high-efficiency power control of a high-efficiency (e.g., hard-limiting or switch-mode) power amplifier in such a manner as to achieve a desired control or modulation. Unlike the prior art, feedback is not required. That is, the amplifier may be controlled without continuous or frequent feedback adjustment. In one embodiment, the spread between a maximum frequency of the desired modulation and the operating frequency of a switch-mode DC-DC converter is reduced by following the switch-mode converter with an active linear regulator. The linear regulator is designed so as to control the operating voltage of the power amplifier with sufficient band-width to faithfully reproduce the desired amplitude modulation waveform. The linear regulator is further designed to reject variations on its input voltage even while the output voltage is changed in response to an applied control signal. This rejection will occur even though the variations on the input voltage are of commensurate or even lower frequency than that of the controlled output variation. Amplitude modulation may be achieved by directly or effectively varying the operating voltage on the power amplifier while simultaneously achieving high efficiency in the conversion of primary DC power to the amplitude modulated output signal. High efficiency is enhanced by allowing the switch-mode DC-to-DC converter to also vary its output voltage such that the voltage drop across the linear regulator is kept at a low and relatively constant level. Time-division multiple access (TDMA) bursting capability may be combined with efficient amplitude modulation, with control of these functions being combined. In addition, the variation of average output power level in accordance with commands from a communications system may also be combined within the same structure.

The high-efficiency amplitude modulation structure may be extended to any arbitrary modulation. Modulation is performed in polar form, i.e., in a quadrature-free manner.

Single high-efficiency stages may be combined together to form high-power, high-efficiency modulation structures.

BRIEF DESCRIPTION OF THE DRAWING

The present invention may be further understood from the following description in conjunction with the appended drawing. In the drawing:

FIG. 9 is a waveform diagram illustrating operation of one embodiment;

FIG. 10 is a waveform diagram illustrating operation of another embodiment;

FIG. 14 is a block diagram of a first high power, high efficiency, amplitude modulating RF amplifier;

FIG. 15 is a waveform diagram illustrating operation of the amplifier of FIG. 14;

FIG. 16 is a block diagram of a second high power, high efficiency, amplitude modulating RF amplifier;

FIG. 17 is a waveform diagram illustrating operation of the amplifier of FIG. 16;

DETAILED DESCRIPTION OF THE PREFERRED EMBODIMENTS

Figure 1:
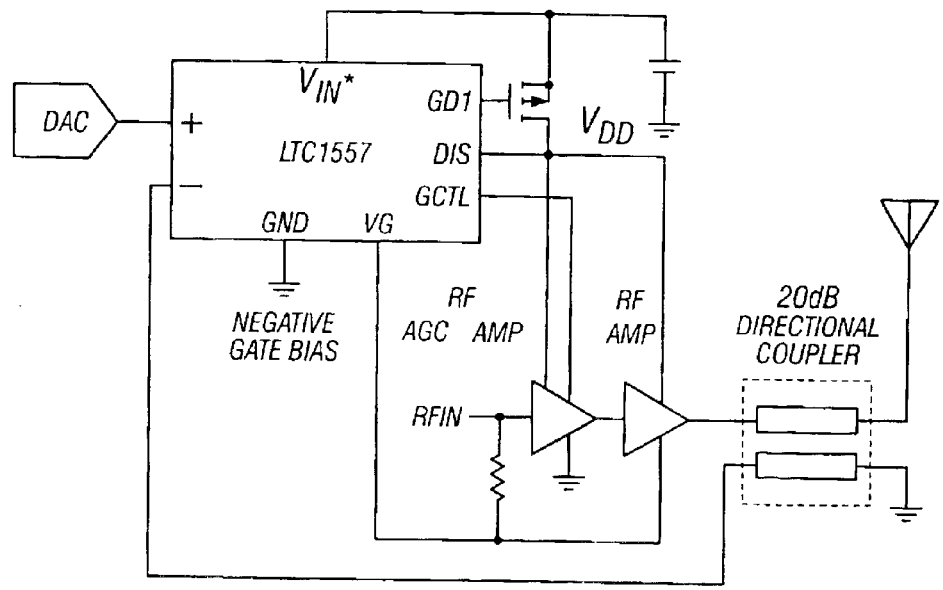
FIG. 1 is a block diagram of a known power amplifier with output power controlled by varying the power supply voltage.
Figure 2:
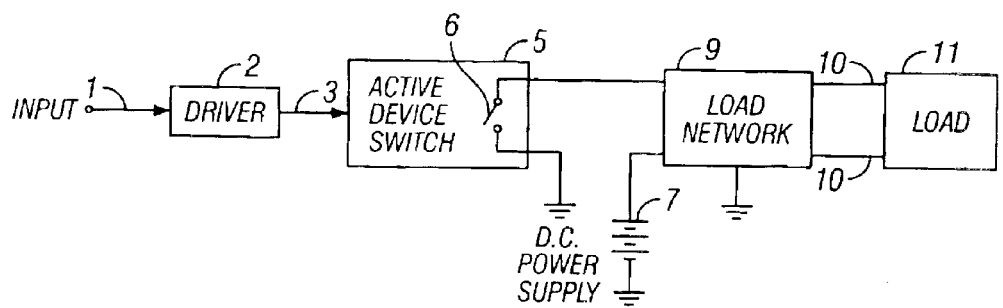
FIG. 2 is a simplified block diagram of a known single-ended switch mode RF amplifier.
Figure 3:
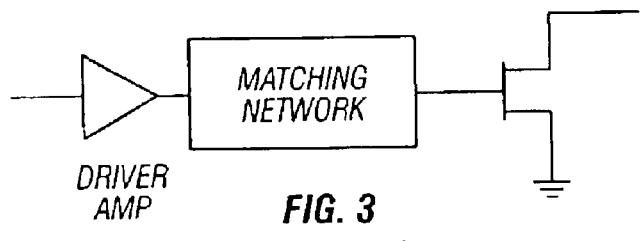
FIG. 3 is a schematic diagram of a portion of a known RF amplifier.
Figure 4:
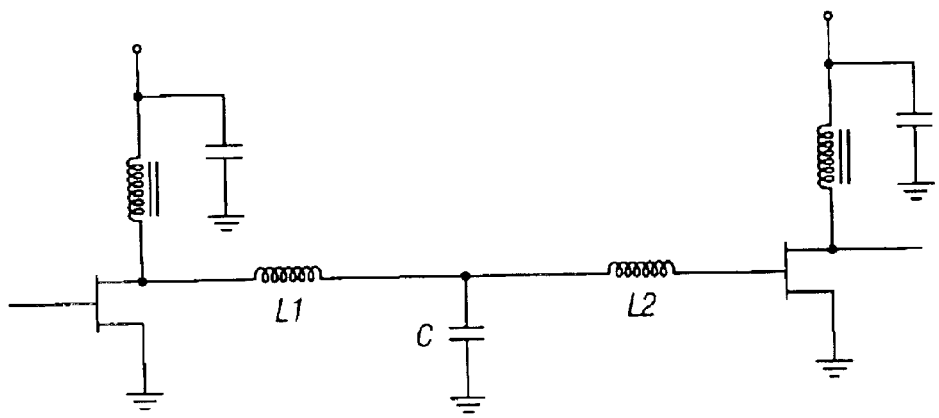
FIG. 4 is a schematic diagram of a conventional RF power amplifier circuit.
Figure 5:
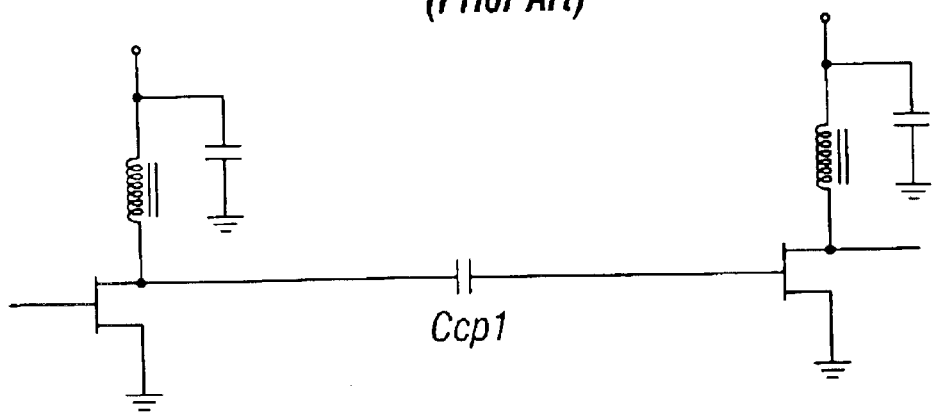
FIG. 5 is a schematic diagram of another conventional RF power amplifier circuit.
Figure 6:
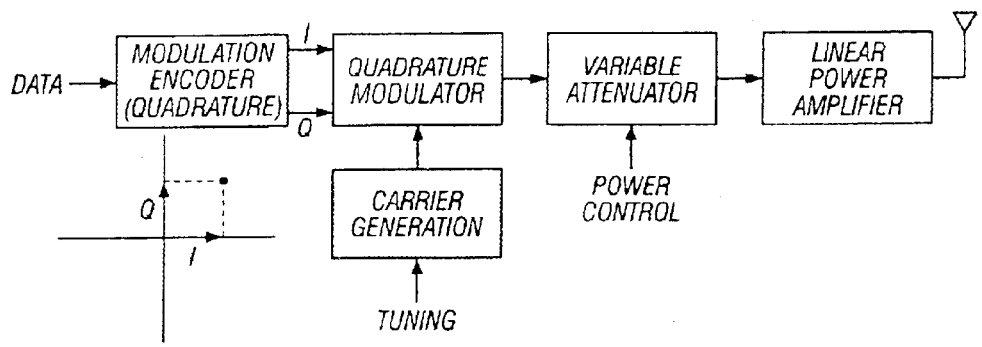
FIG. 6 is a block diagram of a known IQ modulation structure.
Figure 7:
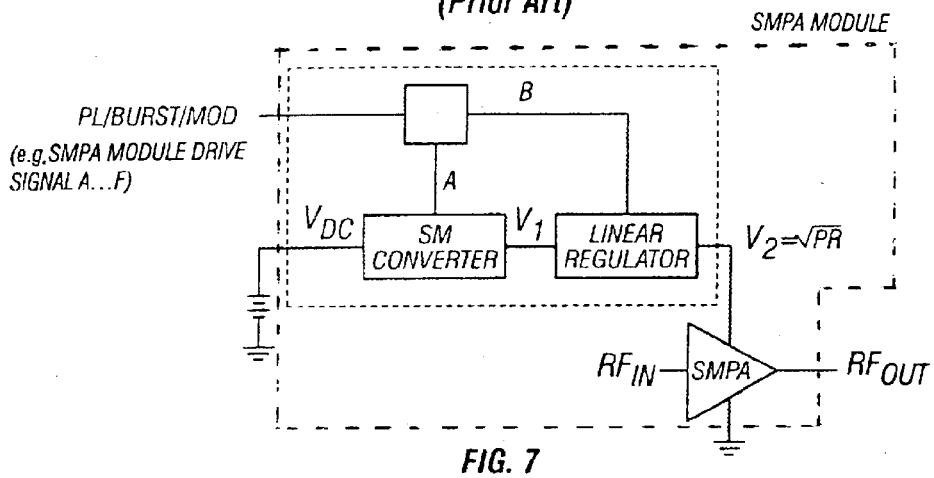
FIG. 7 is a block diagram of a power amplifier in accordance with an exemplary embodiment.

Referring now to FIG. 7, a block diagram is shown of a power amplifier that overcomes many of the aforementioned disadvantages. A switch-mode (or saturated) nonlinear amplifier has applied to it a voltage produced by a power control stage. In an exemplary embodiment, the voltage V applied to the nonlinear amplifier is controlled substantially in accordance with the equation $$V=\sqrt{PR}$$

where P is the desired power output level of the amplifier and R is the resistance of the amplifier. In the case of a switch-mode or saturated amplifier, the resistance R may be regarded as constant. The power control stage receives a DC input voltage, e.g., from a battery, and receives a power level control signal and outputs a voltage in accordance with the foregoing equation.

Figure 8:
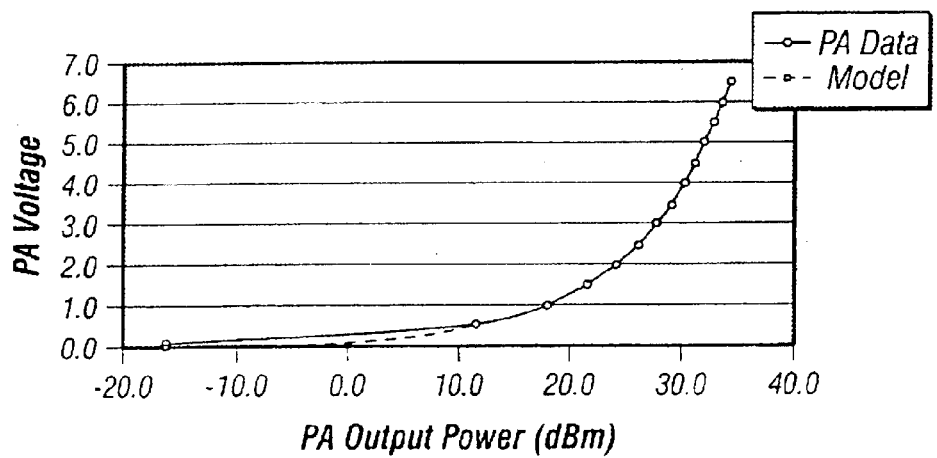
FIG. 8 is a plot comparing saturated Class AB power amplifier output power versus operating voltage with the mathematical model $V=\sqrt{PR}$.

The efficacy of directly controlling output power of nonlinear amplifiers over a wide dynamic range by solely varying the operating voltage is demonstrated by FIG. 8, showing a plot comparing saturated Class AB power amplifier output power versus operating voltage with the mathematical model $V=\sqrt{PR}$.

Referring again to FIG. 7, a power control circuit in accordance with an exemplary embodiment. A power control circuit includes a switch-mode converter stage and a linear regulator stage connected in series. The switch-mode converter may be a Class D device, for example, or a switch-mode power supply (SMPS). The switch-mode converter efficiently steps down the DC voltage to a voltage that somewhat exceeds but that approximates the desired power-amplifier operating voltage level. That is, the switch-mode converter performs an efficient gross power level control. The switch-mode converter may or may not provide sufficiently fine control to define ramp portions of a desired power envelope.

The linear regulator performs a filtering function on the output of the switch-mode converter. That is, the linear regulator controls precise power-envelope modulation during a TDMA burst, for example. The linear regulator may or may not provide level control capabilities like those of the switch-mode converter.

Note that, depending on the speed of the switch-mode converter and the linear regulator, the power control circuit may be used to perform power control and/or amplitude modulation. A control signal PL/BURST/MOD is input to a control block, which outputs appropriate analog or digital control signals for the switch-mode converter and the linear regulator. The control block may be realized as a ROM (read-only memory) and/or a DAC (digital to analog converter).

Referring to FIG. 9, a waveform diagram is shown, illustrating operation of one embodiment of the invention. The waveforms A and B represent analog control signals applied to the switch-mode converter and to the linear regulator, respectively. The waveforms $V_1$ and $V_2$ represent the output voltages of the switch-mode converter and to the linear regulator, respectively. Assume that the switch-mode converter has a relatively large time constant, i.e., that it ramps relatively slowly. When the control signal A is set to a first non-zero power level, the voltage $V_1$ will then begin to ramp toward a commensurate voltage. Because of the switch-mode nature of the converter, the voltage $V_1$ may have a considerable amount of ripple. An amount of time required to reach the desired voltage defines the wakeup period. When that voltage is reached, the control signal B is raised and lowered to define a series of transmission bursts. When the control signal B is raised, the voltage $V_2$ ramps quickly up to a commensurate voltage, and when the control signal B is lowered, the voltage $V_2$ ramps quickly down.

Following a series of bursts (in this example), the control signal A is raised in order to increase the RF power level of subsequent bursts. The control signal B remains low during a wait time. When the voltage $V_1$ has reached the specified level, the control signal B is then raised and lowered to define a further series of transmission bursts.

The voltage $V_2$ is shown in dotted lines superimposed on the voltage $V_1$. Note that the voltage $V_2$ is less than the voltage $V_1$ by a small amount, greater than the negative peak ripple on the voltage $V_1$. This small difference between the input voltage of the linear regulator $V_1$ and the output voltage of the linear regulator $V_2$ makes overall high-efficiency operation possible.

Referring to FIG. 10, in accordance with a different embodiment, the switch-mode converter is assumed to have a relatively short time constant; i.e., it ramps relatively quickly. Hence, when the control signal A is raised, the voltage $V_1$ ramps quickly to the commensurate voltage. The control signal B is then raised, and the voltage $V_2$ is ramped. The time difference between when the control signal A is raised on the control signal B is raised defines the wake up time, which may be very short, maximizing sleep time and power savings. The control signal B is then lowered at the conclusion of the transmission burst, after which the control signal A is lowered. Following the example of FIG. 9, in FIG. 10, when the control signal A is next raised, it defines a higher power level. Again, the voltage $V_2$ is superimposed in dotted lines on the voltage $V_1$.

Figure 11:
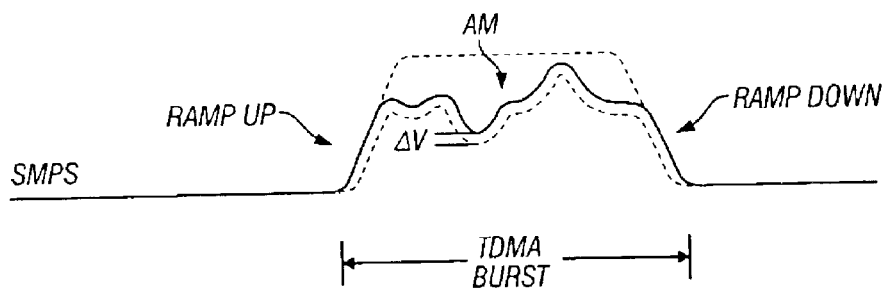
FIG. 11 is a waveform diagram illustrating bursted AM operation.

The same structure may be used to perform amplitude modulation in addition to power and burst control. Referring to FIG. 11, a waveform diagram is shown illustrating bursted AM operation. An output signal of the switch-mode converted is shown as a solid line. As a burst begins, the output signal of the switch-mode converter ramps up. Optionally, as shown in dashed line, the switch-mode converter may ramp up to a fixed level with the linear regulator effecting all of the amplitude modulation on the output signal. More preferably, from an efficiency standpoint, the switch-mode converter effects amplitude modulation, producing an output signal that, ignoring noise, is a small fixed offset $\Delta V$ above the desired output signal. The linear regulator removes the noise from the out put signal of the switch-mode converter, effectively knocking down the signal by the amount $\Delta V$. The output signal of the linear regulator is shown as a dotted line in FIG. 11. At the conclusion of the burst, the signals ramp down.

Figure 12:
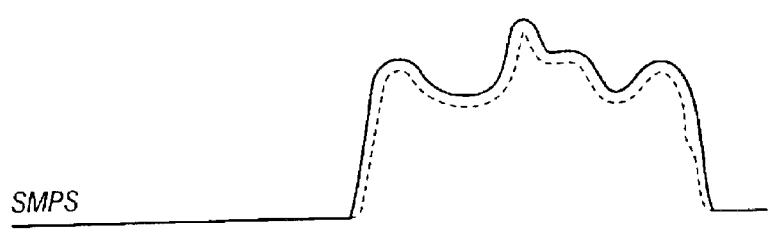
FIG. 12 is a waveform diagram illustrating bursted AM operation with power level control.

Full control of the output signal power level (average power of the signal) is retained. A succeeding burst, for example, might occur at a higher power level, as shown in FIG. 12. As compared to FIG. 11, in FIG. 12, all signals scale appropriately to realize a higher average power output.

Figure 13:
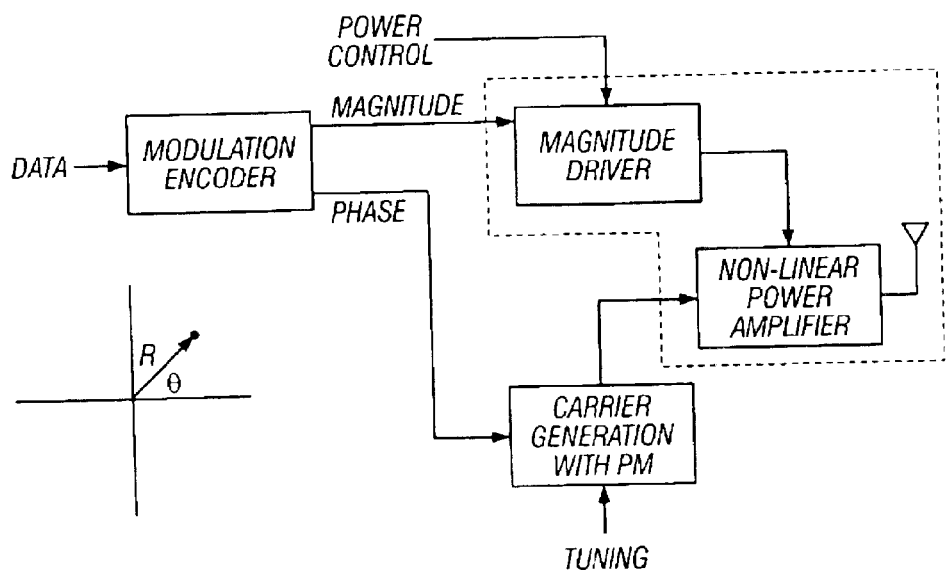
FIG. 13 is a block diagram of a polar modulation structure using a high-efficiency amplifier.

Incorporation of amplitude modulation on a phase-modulated signal, though it complicates the signal generation method, is often desirable since such signals may, and often do, occupy less bandwidth than purely phase-modulated signals. Referring to FIG. 13, a block diagram is shown of a polar modulation structure using a high-efficiency amplifier of the type described thus far. This polar modulation structure is capable of effecting any desired modulation. A data signal is applied to a modulation encoder that produces magitude and phase signals. The phase signal is applied to a phase-modulation-capable carrier generation block, to which a tuning signal is also applied. A resulting signal is then amplified by a non-linear power amplifier of the type previously described. Meanwhile, the magnitude signal is applied to a magnitude driver. The magnitude driver also receives a power control signal. In response, the magnitude driver produces an operating voltage that is applied to the non-linear amplifier. The magnitude driver and the non-linear amplifier may be realized in the same manner as FIG. 7, described previously, as indicated in FIG. 13 by a dashed line.

The modulation structures described thus far are suitable for use in, among other applications, cellular telephone-handsets. A similar need for high-efficiency RF signal generation exists in cellular telephone basestations. Basestations, however, operate at much higher power than handsets. The following structure may be used to achieve high-power, high-efficiency RF signal generation.

Referring to FIG. 14, a first high power, high efficiency, amplitude modulating RF amplifier includes multiple switch mode power amplifier (SMPA) blocks, each block being realized as shown in FIG. 7, for example. An RF signal to be amplified is input to all of the SMPA blocks in common. Separate control signals for each of the SMPA blocks are generated by a magnitude driver in response to a magnitude input signal. Output signals of the SMPA blocks are summed to form a single resultant output signal.

The manner of operation of the amplifier of FIG. 14 may be understood with reference to FIG. 15. On the left-hand side is shown an overall magnitude signal that is applied to the magnitude driver. On the right-hand side are shown SMPA drive signals output by the magnitude driver to be applied to the respective SMPAs. Note that the sum of the individual drive signals yields the overall magnitude signal.

An alternative embodiment of a high-power amplifier is shown in FIG. 16. In this embodiment, instead of generating individual drive signals for the respective SMPAs, a common drive signal is generated and applied in common to all of the SMPAs. At a given instant in time, the common drive signal is caused to have a value that is one Nth of an overall magnitude signal applied to the magnitude driver, where N is the number of SMPAs. The result is illustrated in FIG. 17. Once again, note that the sum of the individual drive signals yields the overall magnitude signal.

Figure 18:
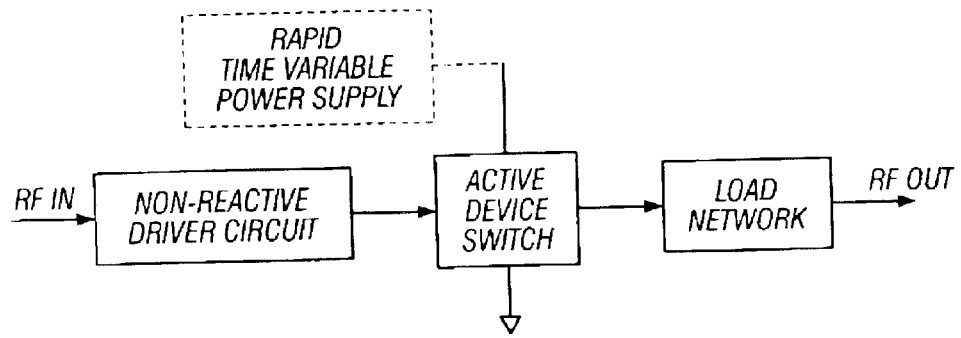
FIG. 18 is a block diagram of an RF switch mode amplifier in accordance with one embodiment.

Referring now to FIG. 18, there is shown a block diagram of an RF switch mode amplifier in accordance with a another embodiment. An RF input signal is applied to a non-reactive driving circuit. The driving circuit is-coupled to an active device to drive the active device switch. The active device switch is coupled to a load network that produces an RF output signal for application to a load, e.g., an antenna. Preferably, power is applied to the active device switch through a rapid time variable power supply, realized by the series combination of a switch mode power supply and a linear regulator, enabling the operating voltage of the active device switch to be varied. By varying the operating voltage in a controlled manner, power control, burst control and modulation may be achieved as described previously.

Figure 19:
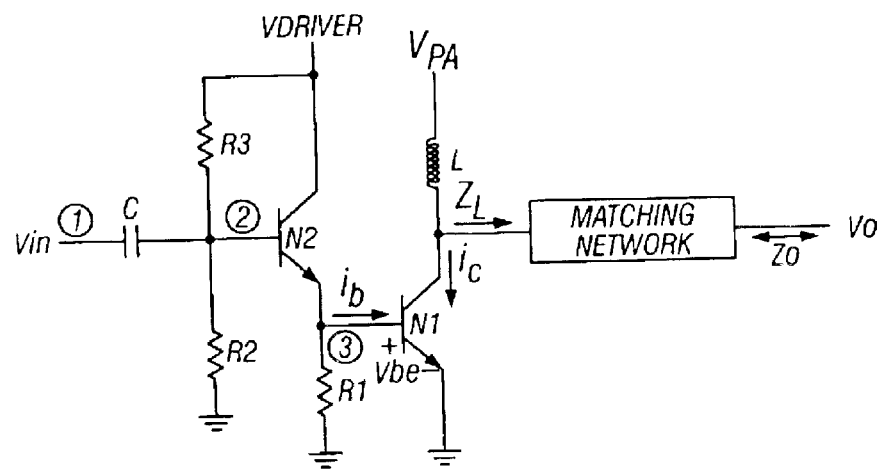
FIG. 19 is a schematic diagram of a portion of an RF switch mode amplifier in accordance with one embodiment of the present invention.

The active device switch may be either a bipolar transistor or a FET transistor. Referring to FIG. 19, a schematic diagram is shown of a portion of an RF switch mode amplifier in which the active device switch is a bipolar transistor having collector, emitter and base terminals. The collector of the bipolar transistor N1 is connected through an RF choke L to an operating voltage $V_{PA}$ and is also connected to an output matching network. The emitter of the bipolar transistor N1 is connected to circuit (AC) ground.

The base of the bipolar transistor N1 is connected to the emitter of another bipolar transistor N2 (the driver transistor) in Darlington fashion. The collector of the driver transistor N2 is connected to an operating voltage $V_{DRIVER}$ and is also connected to a bypass capacitor. Associated with the driver transistor N2 is a bias network including, in the illustrated embodiment, three resistors, R1, R2 and R3. One resistor R1 is connected from the emitter of the driver transistor to circuit ground. Another resistor R2 is connected from the base of the driver transistor to ground. The final resistor R3 is connected from the base of the driver transistor N2 to $V_{DRIVER}$. An RF input signal is applied to the base of the driver transistor through a DC isolation capacitor $C_{in}$.

Figure 20:
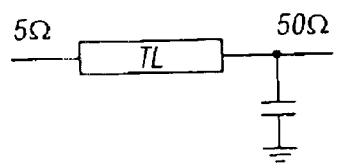
FIG. 20 is a schematic diagram of a suitable load network for use in the RF switch mode amplifier of FIG. 19.

Referring to FIG. 20, the output network may take the form of an impedance-matching transmission line TL and a capacitor $C_{out}$.

Figure 21:
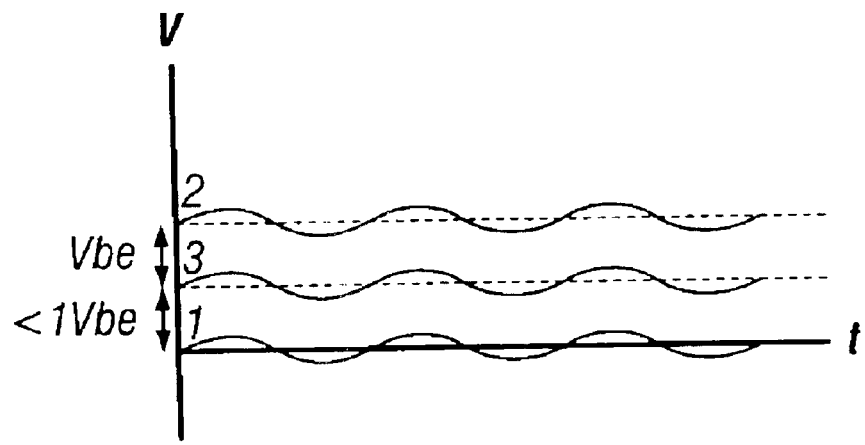
FIG. 21 is a waveform diagram showing input voltage and related waveforms for the RF switch mode amplifier of FIG. 19.
Figure 22:
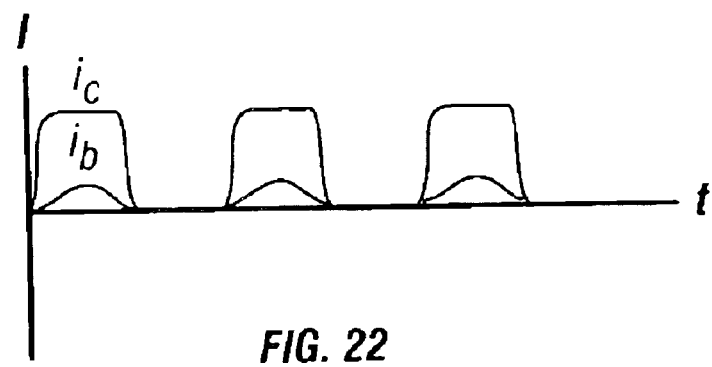
FIG. 22 is a waveform diagram showing base and collector current waveforms of the switching transistor of FIG. 19.
Figure 23:
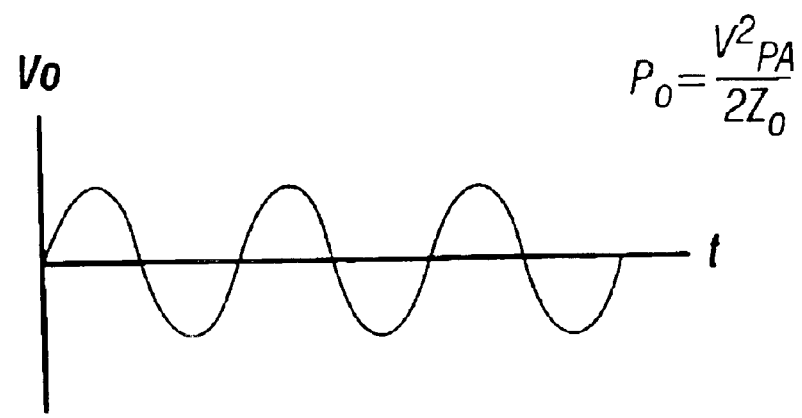
FIG. 23 is a waveform diagram showing output voltage for the RF switch mode amplifier of FIG. 19.

The RF input voltage signal is sinusoidal as shown by waveform 1 of FIG. 21. The input voltage is level shifted upward to produce a voltage at the base of the driver transistor N2, shown by waveform 2. The emitter voltage of the driver transistor N2, shown by waveform 3, is one $V_{be}$ drop below and is applied to the base of the switching transistor N1. At the beginning of the positive half-cycle, the driver transistor N2 is operating as an emitter follower, with output (emitter) voltage sufficiently below the turn-on voltage of the switching transistor N1 so that the switching transistor N1 is cut off. As the signal increases, the driver transistor N2 turns the switching transistor N1 on and drives it into saturation as shown in FIG. 22. Current flows through the RF choke L and through the switching transistor N1, and the output voltage decreases as the capacitor $C_{out}$ is discharged as shown in FIG. 23. Near the end of the positive half-cycle, the driver transistor N2 output voltage falls below the turn-on voltage of the switching transistor N1, allowing it to turn off. The value of the resistor R1 is chosen such that the switching transistor N1 quickly cuts off. Current continues to flow through the RF choke L, charging the capacitor $C_{out}$ and causing the output voltage to increase.

Figure 24:
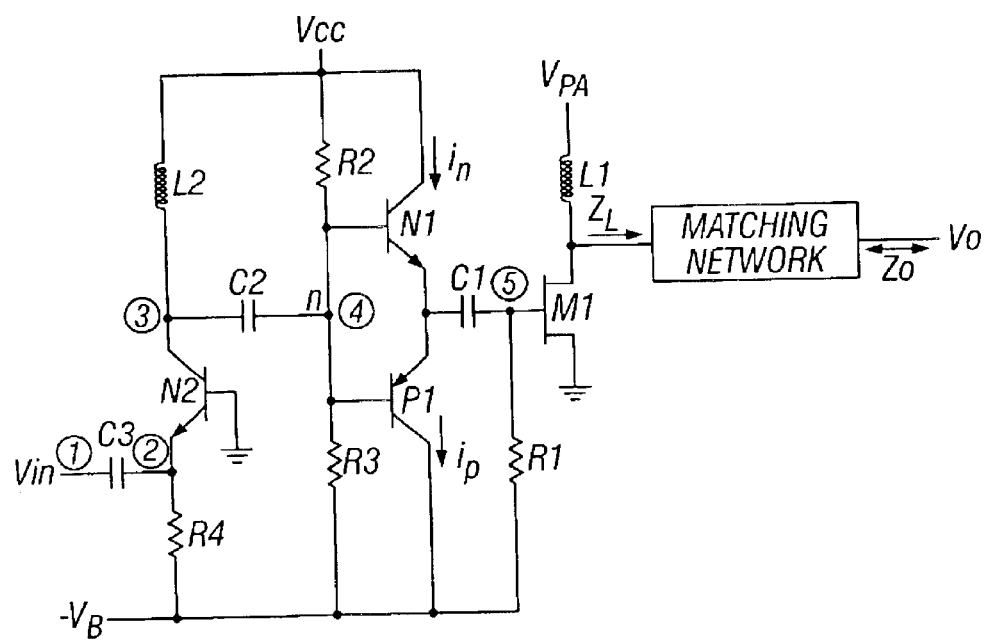
FIG. 24 is a schematic diagram of a portion of an RF switch mode amplifier in accordance with another embodiment.

Referring to FIG. 24, a schematic diagram is shown of a portion of an RF switch mode amplifier in which the active device switch is a FET transistor (MES-FET, JFET, PHEMT, etc.) having drain, source and gate terminals. The drain of the FET transistor M1 is connected through an RF choke L1 to an operating voltage $V_{PA}$ and is also connected to an output network. The source of the FET transistor is connected to circuit (AC) ground.

The gate of the FET transistor is biased from supply $-V_B$ through a large value resistor R1, and is further connected through a DC isolation capacitor C1 to a pair of bipolar transistors (driver transistors) connected in push-pull arrangement. The driver transistors include an NPN transistor N1 and a PNP transistor P1. The collector of the NPN driver transistor N1 is connected to an operating voltage $V_{CC}$ and is also connected to a bypass capacitor. The collector of the PNP driver transistor P1 is connected to a negative reference voltage $-V_B$ and is also connected to a bypass capacitor. The bases of the driver transistors are connected in common. Large-valued resistors R2 and R3 connect the common node to the respective power supply rails.

A further NPN bipolar transistor N2 is connected in common base configuration. The emitter of the further bipolar transistor is connected through a resistor R4 to $-V_B$ and is connected through a capacitor C3 to the RF input signal. The collector of the further bipolar transistor is connected through an inductor L2 to $V_{CC}$ and is also connected to a bypass capacitor.

Figure 25:
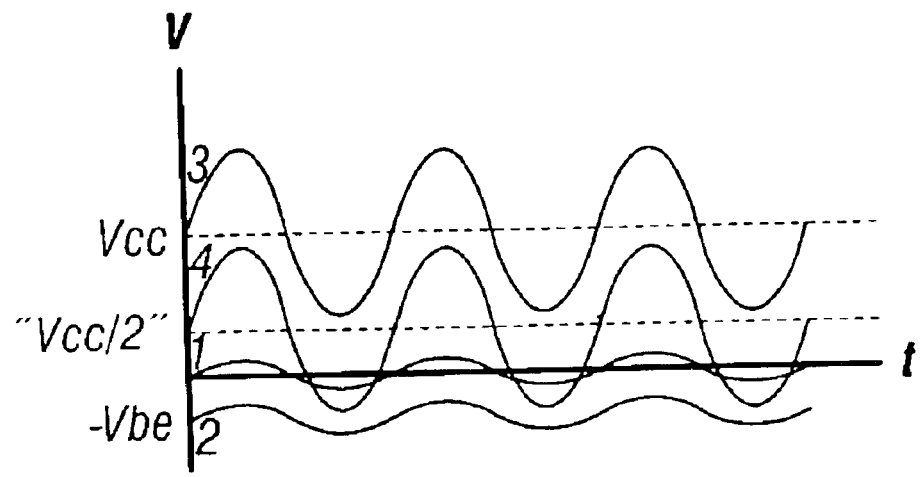
FIG. 25 is a waveform diagram showing input voltage and related waveforms for the RF switch mode amplifier of FIG. 24.
Figure 26:
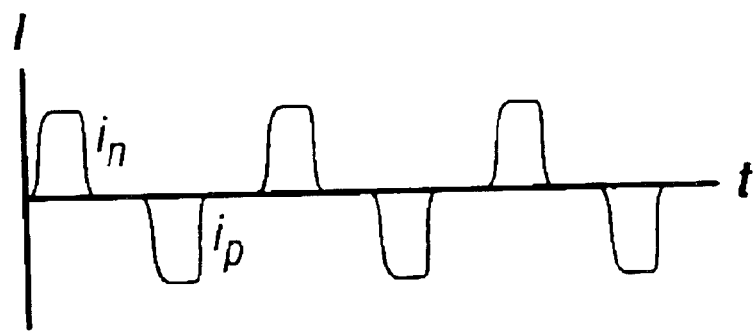
FIG. 26 is a waveform diagram showing collector current waveforms of the drive transistors of FIG. 24.
Figure 27:
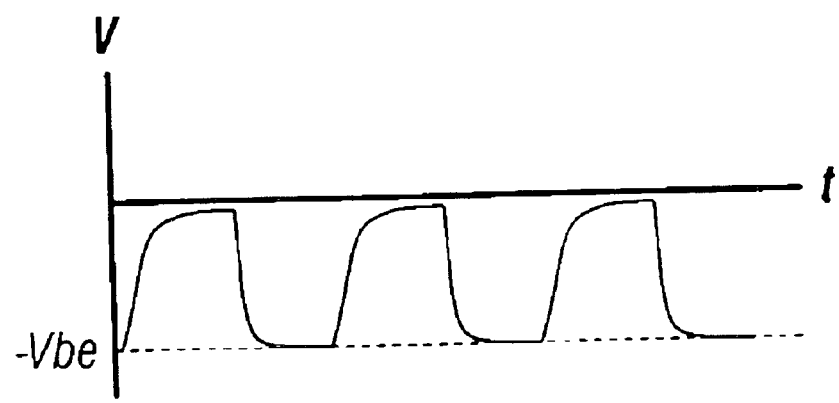
FIG. 27 is a waveform diagram showing a gate voltage waveform of the switching transistor of FIG. 24.

Referring to FIG. 25, input voltage waveforms 1–4 are shown for the circuit of FIG. 24. The input voltage 1 is level shifted down one $V_{be}$ (producing voltage 2) and is then applied to the emitter of the bipolar transistor N2. A large voltage swing 3 is produced at the collector of the bipolar transistor N2 by action of the inductor L2. This voltage swing is level shifted downward produce a voltage 4 that is applied to the bases of the driver transistors at node n. In operation, during the positive half-cycle, initially the further bipolar transistor N2 is turned off. Current flows through the inductor L2 into the capacitor C2 coupled to the bases of the transistor pair, causing the NPN transistor N1 to turn on and causing the PNP transistor P1 to turn off (FIG. 26). The DC isolation capacitor C1 is charged up from the $V_{CC}$ supply, raising the gate potential of the FET M1, causing it to turn on (FIG. 27). During the negative half-cycle, the further bipolar transistor N2 is turned on. Current flows through the inductor L2, through the further transistor N2 to the $-V_B$ rail. Current also flows out of the base of the PNP transistor P1, turning it on. The DC isolation capacitor C1 discharges, lowering the gate potential of the FET M1, causing it to turn off. The output network operates in the same manner as previously described.

Figure 28:
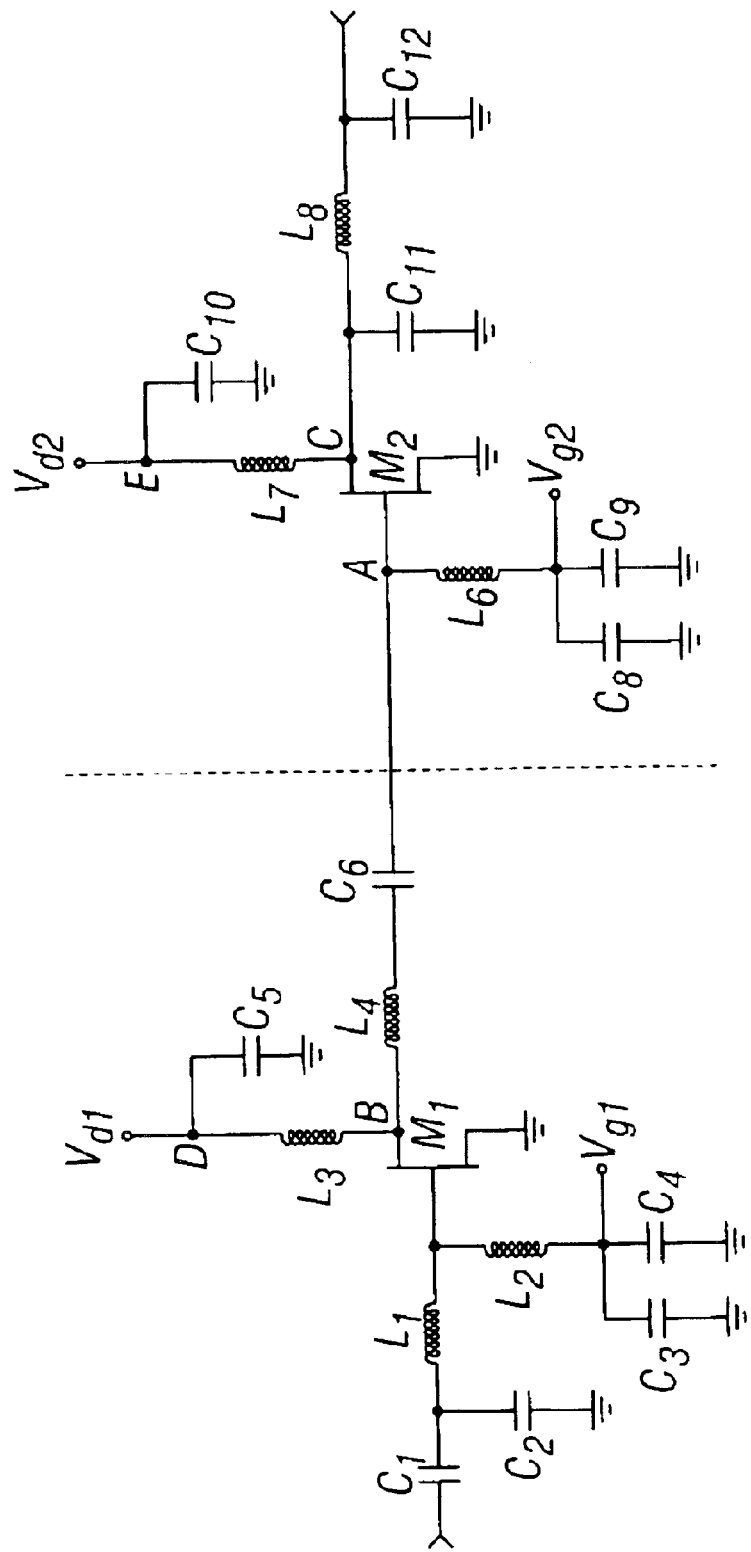
FIG. 28 is a schematic diagram of an RF power amplifier circuit in accordance with another embodiment.

Referring now to FIG. 28, a schematic diagram is shown of a multi-stage RF power amplifier circuit with which the foregoing driver circuit may be used. An input matching circuit composed of a coupling capacitor $C_1$, a capacitor $C_2$ and an inductor $L_1$ is used to set the input impedance of the circuit. A driver stage $M_1$ and a final stage $M_2$ are shown as FETs, although in other embodiments bipolar transistors may be used. The drain electrode of the FET $M_1$ is coupled to a supply voltage $V_{d1}$ through a drain bias network including an RF choke $L_3$ and a capacitor $C_5$. Similarly, the drain electrode of the FET $M_2$ is coupled to a supply voltage $V_{d2}$ through a drain bias network including an RF choke $L_7$ and a capacitor $C_{10}$.

Respective gate bias networks are provided for the stages $M_1$ and $M_2$. In the case of the stage $M_1$, the gate bias network is composed of an inductor $L_2$, a capacitor $C_3$ and a capacitor $C_4$ connected at a common node to a voltage $V_{g1}$. In the case of the stage $M_2$, the gate bias network is composed of an inductor $L_6$, a capacitor $C_8$ and a capacitor $C_9$ connected at a common node to a voltage $V_{g2}$.

The driver stage and the final stage are coupled by an interstage network, shown here as a series LC combination composed of an inductor $L_4$ and a capacitor $C_6$, values of which are chosen so as to provide a resonance with the input capacitance of the final stage $M_2$. The final stage $M_2$ is coupled to a conventional load network, illustrated in this example as a CLC Pi network composed of a capacitor $C_{11}$, an inductor $L_8$ and a capacitor $C_{12}$, values of which are determined in accordance with characteristics of the final stage $M_2$.

In an exemplary embodiment, component values may be as follows, where capacitance is measured in picofarads and inductance is measured in nanohenries:

TABLE 1

| Capacitor | pf | Inductor | nh | Voltage | V |
|---|---|---|---|---|---|
| $C_1$ | 27 | $L_1$ | 8.2 | $V_{d1}$ | 3.3 |
| $C_2$ | 10 | $L_2$ | 33 | $V_{d2}$ | 3.2 |
| $C_3$ | 0.01 | $L_3$ | 33 | $V_{g1}$ | −1.53 |
| $C_4$ | 27 | $L_4$ | 4.7 | $V_{g2}$ | −1.27 |
| $C_5$ | 27 | $L_5$ | NA | | |
| $C_6$ | 27 | $L_6$ | 39 | | |
| $C_7$ | NA | $L_7$ | 15 | | |
| $C_8$ | 27 | $L_8$ | 2.7 | | |
| $C_9$ | 0.01 | | | | |
| $C_{10}$ | 27 | | | | |
| $C_{11}$ | 1.5 | | | | |
| $C_{12}$ | 5.6 | | | | |

Figure 29:
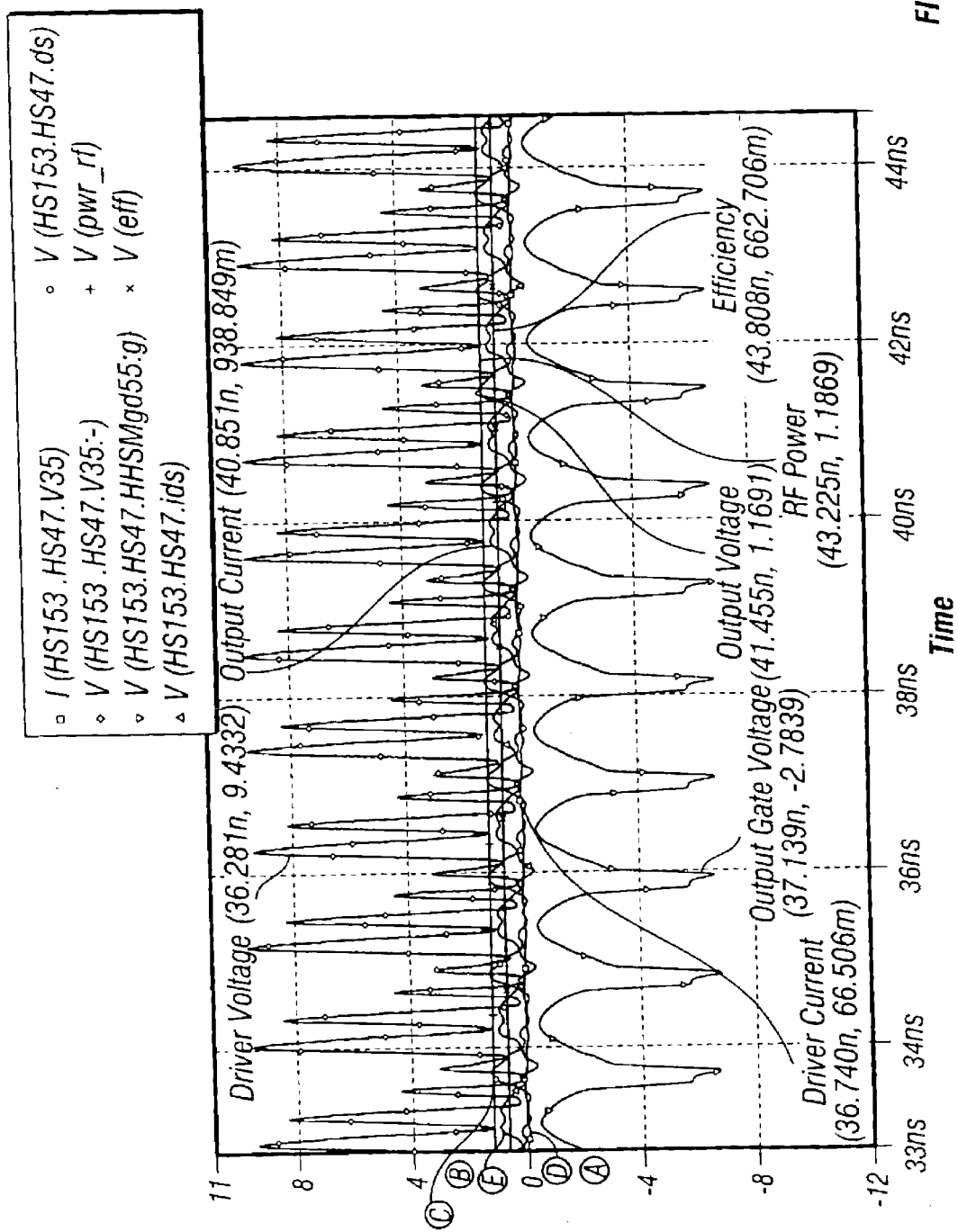
FIG. 29 is a waveform diagram showing waveforms occurring at selected nodes of the amplifier circuit of FIG. 28.

In the example of FIG. 28, the driver stage, stage $M_1$, is operated in switch mode. Referring to FIG. 29, waveforms diagrams are provided showing the input voltage to the stage $M_2$ at node A, the drain voltage of the stage $M_1$ at node B, the drain voltage of the stage $M_2$ at node C, the drain current of the stage $M_1$ at node D, and the drain current of the stage $M_2$ at node E. Note that the peak value of the gate voltage of the final stage, stage $M_2$ (waveform A), is considerably greater than in conventional designs. In this arrangement, the input drive of the switch may be sufficiently high that the operating voltage of the driver stage may be reduced. This reduction further reduces the DC supply power to the driver, enhancing PAE.

Using circuits of the type illustrated, PAE of 72% has been measured at an output power of 2W.

Hence, there has been described power amplifier circuit arrangements, including driving circuits and a multi-stage amplifier circuit, that allow for precise generation of a desired RF waveform without the need for feedback and with high power-added efficiency.

What is claimed is:

1. An RF amplifier apparatus, comprising:
   a plurality of amplifiers modules, each amplifier module comprising a nonlinear switch-mode RF amplifier having an RF input configured to receive common RE input signal, and a power controller having a magnitude control input;
   a magnitude driver, responsive to a magnitude input signal, operable to provide magnitude control signals to said magnitude control inputs of said plurality of power controllers; and
   a summer configured to receive RF output signals from said plurality of amplifiers modules and provide a resultant RF output signals,
   wherein said RF input signal drive one or more of said nonlinear switch-mode RF amplifiers between a hard-on state and a hard-off state, without operating said nonlinear switch-mode RF amplifiers in linear operating regions for any appreciable any percentage of time.

2. The RF amplifier apparatus of claim 1 wherein the RF input signal is a phase modulated RF input signal.

3. The RF amplifier apparatus of claim 1 wherein each power controller has a power supply input port configured to receive a DC supply voltage and a power control output configured to provide a variable supply output voltage to a supply input of its associated nonlinear switch-mode RF amplifier.

4. The RF amplifier apparatus of claim 3 wherein each power controller comprises a switch-mode converter configure to receive the DC supply voltage and provide the variable supply output voltage, said variable supply output voltage approximating a desired operating voltage level of said each power controller's associated nonlinear switch-mode RF amplifier.

5. The RF amplifier apparatus of claim 4 wherein each power controller further comprises a regulator coupled between the supply input of its associated nonlinear switch-mode RF amplifier and an output of the switch-mode vower converter.

6. The RF amplifier apparatus of claim 5 wherein each switch-mode converter comprises a switch-mode power supply.

7. The RF amplifier apparatus of claim 1 wherein said magnitude control signals derive from a common magnitude control signal generated by said magnitude driver.

8. The RF amplifier apparatus of claim 1 wherein said magnitude control signals are individual and separate magnitude control signals generated for each associated power contoller.

9. The RF amplifier apparatus of claim 1 wherein each nonlinear switch-mode RF amplifier comprises a Class D amplifier.

10. The RF amplifier apparatus of claim 1 wherein each nonlinear switch-mode RF amplifier comprises a Class E amplifier.

11. The RF amplifier apparatus of claim 1 wherein each nonlinear switch-mode RF amplifier comprises a Class F amplifier.

12. A method of amplifying an RF signal, comprising:
    applying an RF input signal to RF inputs of a plurality of nonlinear switch-mode RF amplifiers, said RF input signal operable to drive one or more of said nonlinear switch-mode RF amplifiers repeatedly between a hard-on state and a hard-off state, without operating said one or more nonlinear switch-mode RF amplifiers in linear operating region for any appreciable percentage of time;
    applying magnitude control signals to magnitude control inputs of a plurality of power controllers associated with said plurality of nonlinear switch-mode RF amplifiers;
    amplifying said RF input by said plurality of nonlinear switch-mode RF amplifiers, in accordance with associated magnitude control signals; and
    summing RF output signals from the plurality of nonlinear switch-mode RF amplifiers to form a resultant RF output signal.

13. The method of claim 12 Wherein th RF input signal is a phase modulated signal.

14. The method of claim 12, further comprising:
    applying a DC supply voltage to power supply input ports of each of aid plurality of power controllers;
    generating a plurality of variable supply output voltages and;
    applying said variable supply output voltages to supply inputs of said plurality of nonlinear switch-mode RF amplifiers.

15. The method of claim 14 wherein generating a plurality of variable supply output voltages comprises convert said DC supply voltage to asaid variable supply output voltages, said plurality of DC variable supply output voltages approximating desired operating voltage levels of said plurality of nonlinear switch-mode RF amplifiers.

16. The method of claim 15 wherein generating a plurality of variable supply output voltages further comprises regulating said DC variable supply output voltages.

17. The method of claim 15 wherein converting said DC supply voltage to a plurality of variable supply output voltages is performed by an associated plurality of switch-mode converters.

18. The method of claim 12 wherein each switch-mode power amplifier comprises a Class D amplifier.

19. The method of claim 12 wherein each switch-mode power amplifier comprises a Class E amplifier.

20. An RF amplifier apparatus, comprising:
    a plurality of RF amplifier modules, each RF amplifier module having a power control circuit and a nonlinear RF amplifier, and each RF amplifier module configured to receive an RF input signal; and
    a summer configured to receive RF output signals from said plurality of amplifier modules,
    wherein said RF input signal drives one or more of said nonlinear RF amplifiers repeatedly between a hard-on state and a hard-off state, without operating said nonlinear RF amplifiers in linear operating regions for any appreciable percentage of time.

21. The RF amplifier apparatus of claim 20 wherein th nonlinear RF amplifiers comprise switch-mode amplifiers.

22. The RF amplifier apparatus of claim 20 wherein th power control circuits each include a switch-mode converter configured to receive DC supply voltage and provide a converted supply voltage.

23. The RF amplifier apparatus of claim 22 wherein the switch-mode converters provide ramp and level control.

24. The RF amplifier apparatus of claim 20 wherein th power control circuits each include a regulator configured to provide ramp and level control.

25. The RF amplifier apparatus of claim 21 wherein ea of the power control circuits further includes a regulator coupled between an output of the switch-mode converter and power control input of an associated nonlinear RF amplifier.

* * * * *